(12) United States Patent
Kamioka et al.

(10) Patent No.: US 7,645,711 B2
(45) Date of Patent: Jan. 12, 2010

(54) SEMICONDUCTOR DEVICE FABRICATION METHOD

(75) Inventors: Isao Kamioka, Tokyo (JP); Yoshio Ozawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 11/106,468

(22) Filed: Apr. 15, 2005

(65) Prior Publication Data
US 2006/0166421 A1    Jul. 27, 2006

(30) Foreign Application Priority Data
Jan. 24, 2005    (JP) ............................. 2005-015201

(51) Int. Cl.
*H01L 21/31* (2006.01)
(52) U.S. Cl. .............................. 438/787; 257/E21.278
(58) Field of Classification Search ................ 438/758, 438/787, 778, 797, 781, 792, 424, 404
See application file for complete search history.

(56) References Cited

U.S. PATENT DOCUMENTS

| 2002/0115306 A1 * | 8/2002 | Won et al. ................ 438/781 |
| 2003/0011025 A1 * | 1/2003 | Tsuji ........................ 257/316 |
| 2004/0238881 A1 | 12/2004 | Ozawa |
| 2006/0166428 A1 * | 7/2006 | Kamioka et al. ............ 438/201 |
| 2008/0261370 A1 * | 10/2008 | Kamioka et al. ............ 438/303 |

FOREIGN PATENT DOCUMENTS

| JP | 4-286321 | 10/1992 |
| JP | 2002-064155 | 2/2002 |

OTHER PUBLICATIONS

Hoffmann, Roald. The Story of O, American Scientist, vol. 92, No. 1, pp. 23-26 (2004).*

* cited by examiner

*Primary Examiner*—Walter L Lindsay, Jr.
*Assistant Examiner*—Reema Patel
(74) *Attorney, Agent, or Firm*—Finnegan, Henderson, Farabow, Garrett & Dunner, L.L.P.

(57) ABSTRACT

According to the present invention, there is provided a semiconductor device fabrication method comprising:
  forming a first insulating film on a semiconductor substrate;
  forming a conductive layer on the first insulating film;
  exposing the first insulating film by removing a portion of the conductive layer;
  forming a second insulating film on the exposed surface of the first insulating film in a first processing chamber isolated from an outside;
  performing a modification process on the second insulating film in the first processing chamber, and then unloading the semiconductor substrate from the first processing chamber to the outside; and
  annealing the second insulating film in a second processing chamber.

15 Claims, 13 Drawing Sheets

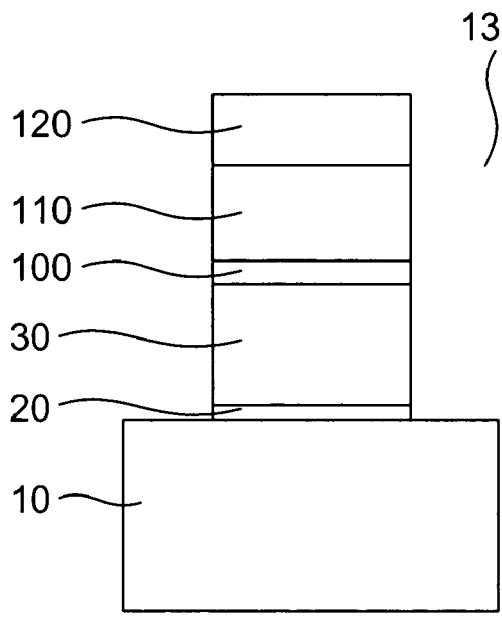 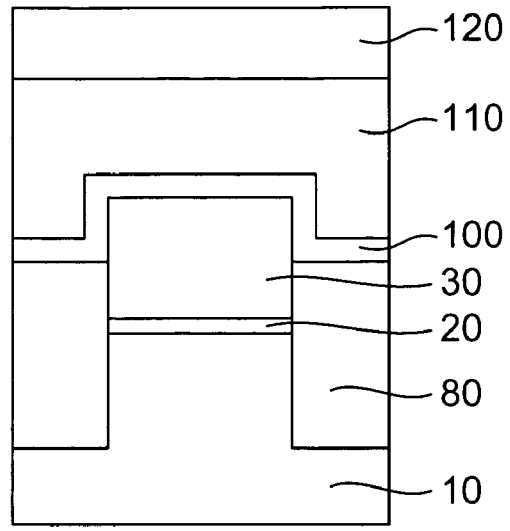
FIG. 4A   FIG. 4B
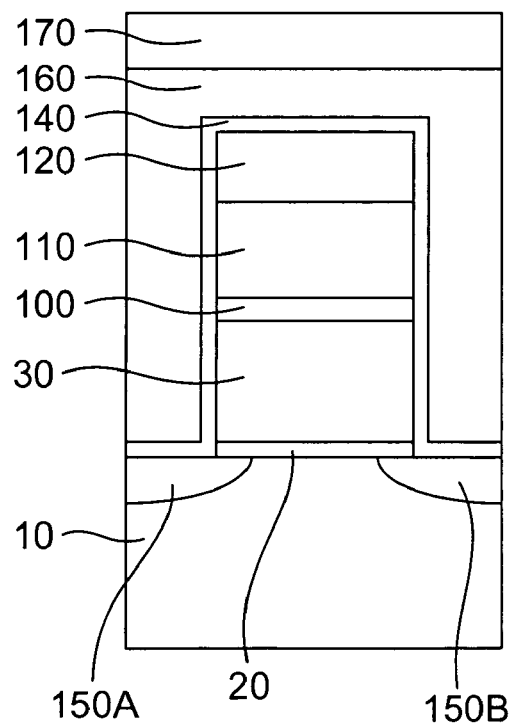 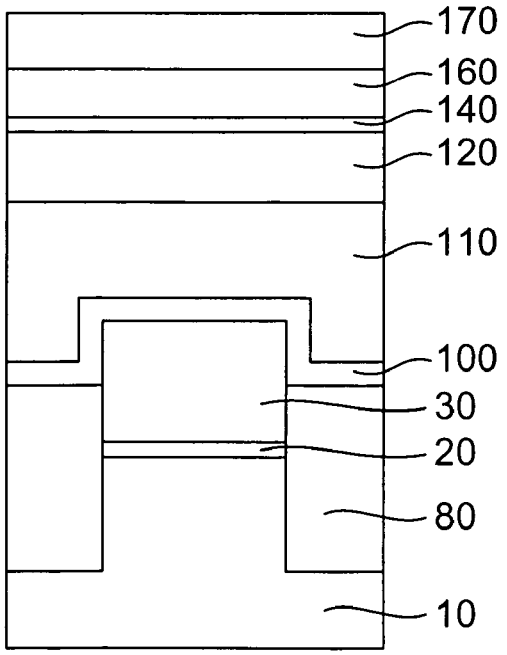
FIG. 5A   FIG. 5B

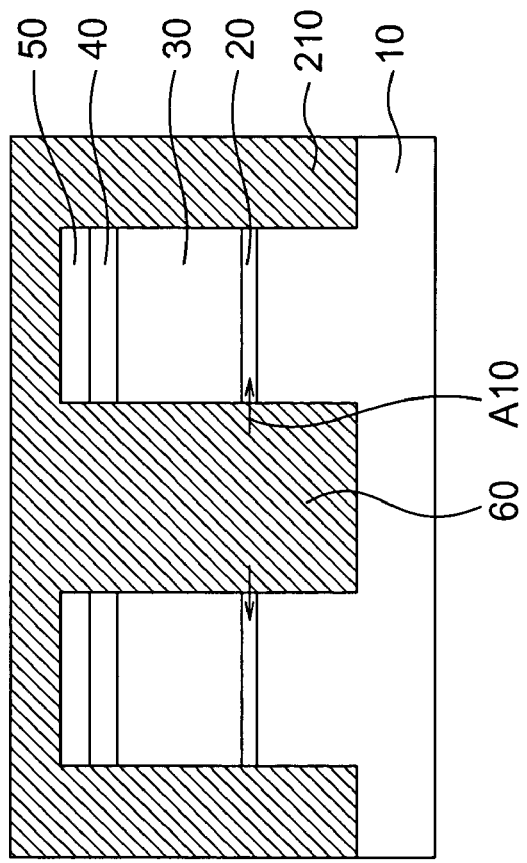
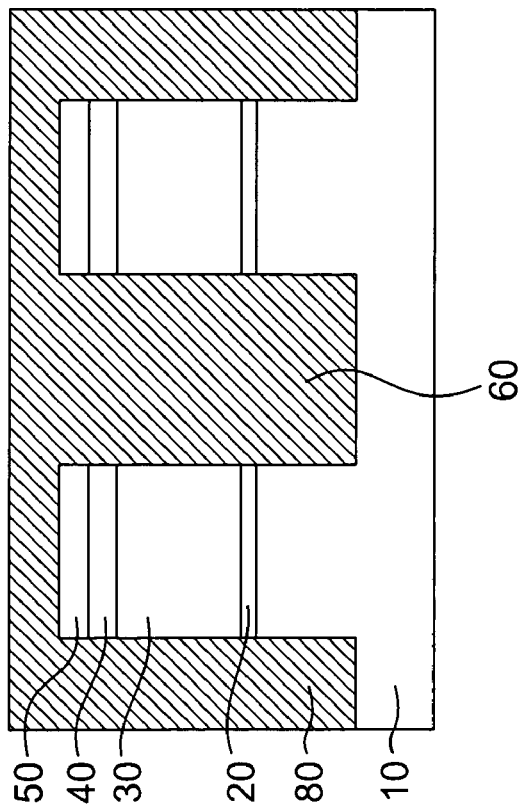
FIG. 8B
FIG. 8A

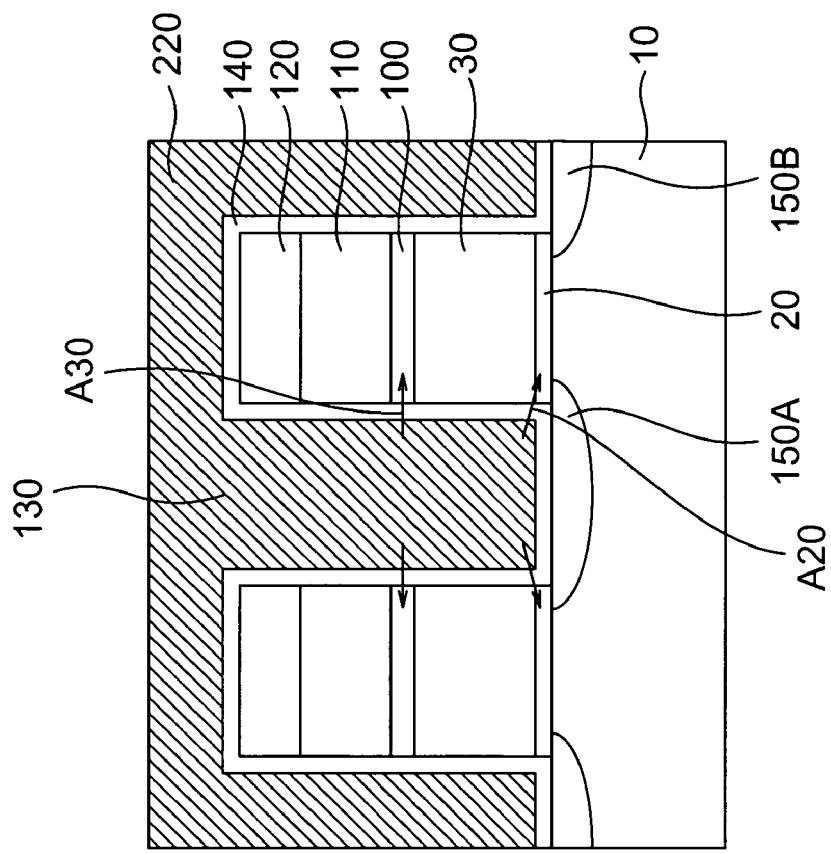
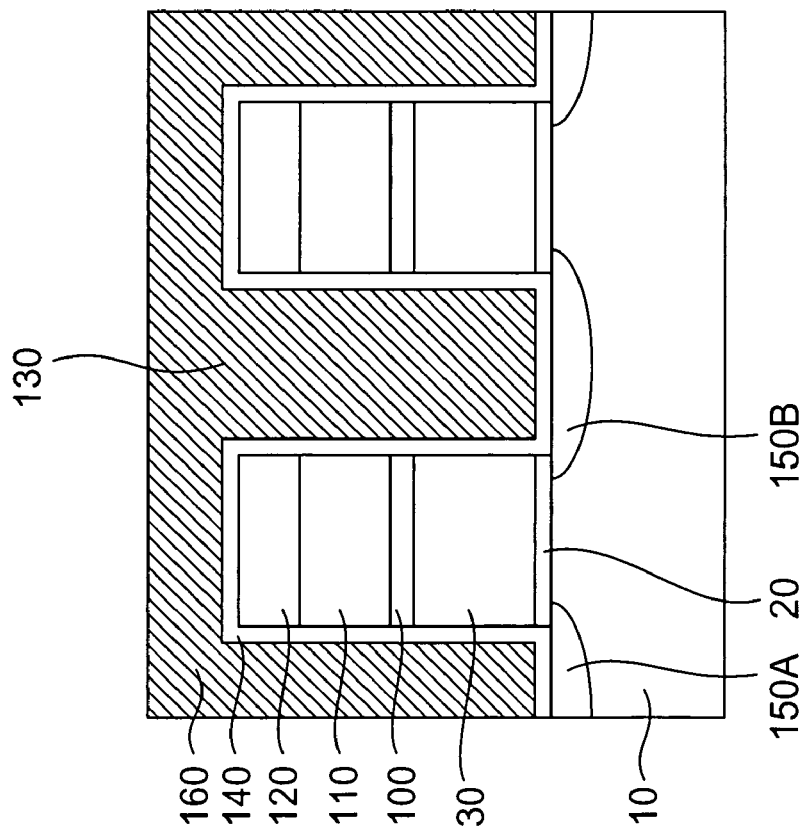

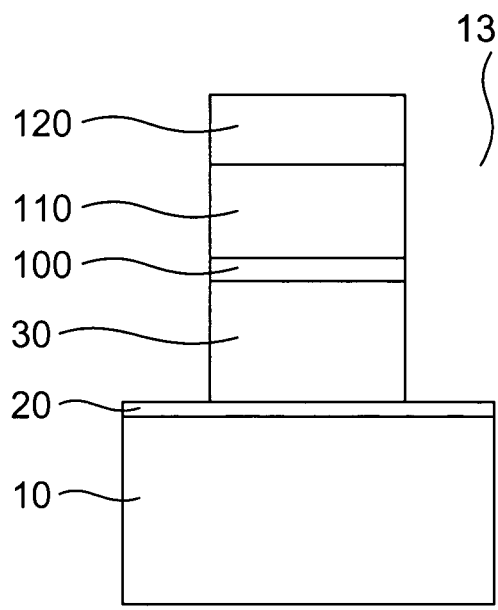
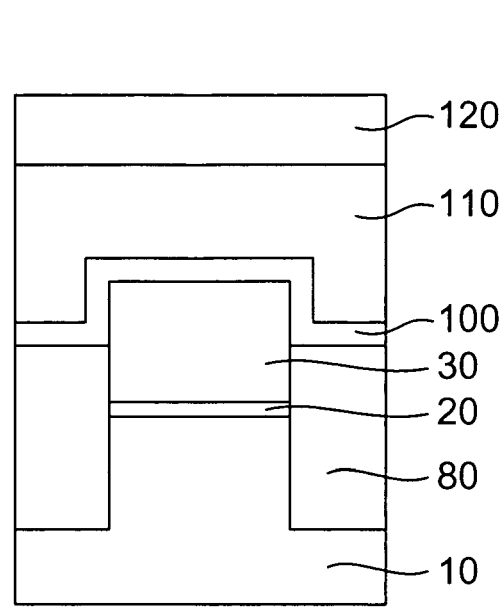
FIG. 18A  FIG. 18B
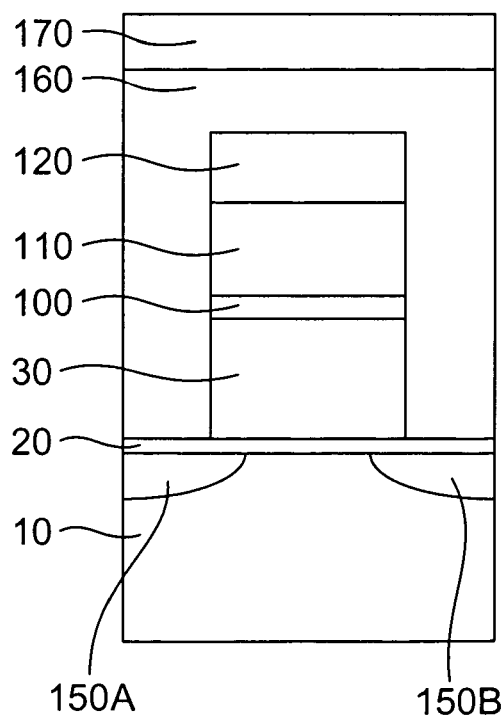
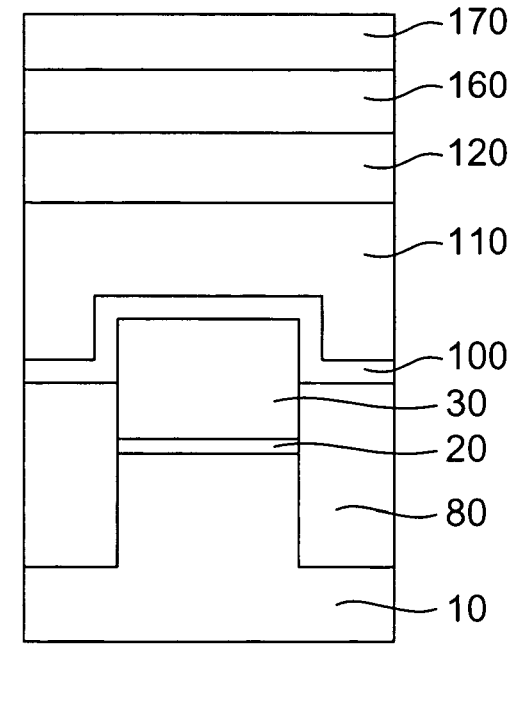
FIG. 19A  FIG. 19B

SEMICONDUCTOR DEVICE FABRICATION METHOD

CROSS REFERENCE TO RELATED APPLICATION

This application is based upon and claims benefit of priority under 35 USC § 119 from the Japanese Patent Application No. 2005-15201, filed on Jan. 24, 2005, the entire contents of which are incorporated herein by reference.

BACKGROUND OF THE INVENTION

The present invention relates to a semiconductor device fabrication method.

Conventionally, a NAND flash memory has been developed as a nonvolatile semiconductor memory. A memory cell transistor of this NAND flash memory has a structure in which a floating gate electrode formed on a semiconductor substrate via a tunnel insulating film and a control gate electrode formed on this floating gate electrode via an inter-electrode insulating film are stacked.

The NAND flash memory is formed by arranging memory cell transistors in a matrix. Between memory cell transistors adjacent to each other in a bit line direction, an inter-cell embedded insulating film is formed and embedded in slits (gaps) formed between these adjacent memory cell transistors.

In the NAND flash memory, a silicon nitride film is used as this inter-cell embedded insulating film. Since, however, the silicon nitride film has a high relative dielectric constant, the influence of a floating capacitance between memory cell transistors increases as the cell size decreases.

A reference concerning an inter-cell embedded insulating film formation method is as follows.

Reference 1: Japanese Patent Laid-Open No. 4-286321

SUMMARY OF THE INVENTION

According to one aspect of the present invention, there is provided a semiconductor device fabrication method comprising:

forming a first insulating film on a semiconductor substrate;

forming a conductive layer on the first insulating film;

exposing the first insulating film by removing a portion of the conductive layer;

forming a second insulating film on the exposed surface of the first insulating film in a first processing chamber isolated from an outside;

performing a modification process on the second insulating film in the first processing chamber, and then unloading the semiconductor substrate from the first processing chamber to the outside; and annealing the second insulating film in a second processing chamber.

According to one aspect of the present invention, there is provided a semiconductor device fabrication method comprising:

forming a first insulating film on a semiconductor substrate;

forming a first conductive layer on the first insulating film;

forming a second insulating film on the first conductive layer;

forming a second conductive layer on the second insulating film;

forming a plurality of projections by sequentially patterning the second conductive layer, second insulating film, first conductive layer, and first insulating film;

embedding a third insulating film in recesses formed between the projections adjacent to each other in a first processing chamber isolated from an outside;

performing a modification process on the third insulating film in the first processing chamber, and unloading the semiconductor substrate from the first processing chamber to the outside; and annealing the third insulating film in a second processing chamber.

According to one aspect of the present invention, there is provided a semiconductor device fabrication method comprising:

forming a gate electrode on a semiconductor substrate via a gate insulating film;

forming a source region and drain region by ion-implanting a predetermined impurity into a surface portion of the semiconductor substrate by using the gate electrode as a mask;

forming an insulating film on the semiconductor substrate and gate electrode in a first processing chamber isolated from an outside;

performing a modification process on the insulating film in the first processing chamber, and then unloading the semiconductor substrate from the first processing chamber to the outside; and annealing the insulating film in a second processing chamber.

BRIEF DESCRIPTION OF THE DRAWINGS

FIGS. 4A and 4B are longitudinal sectional views each showing the sectional structure of elements in a predetermined step of the method of fabricating the NAND flash memory;

FIGS. 5A and 5B are longitudinal sectional views each showing the sectional structure of elements in a predetermined step of the method of fabricating the NAND flash memory;

FIGS. 8A and 8B are longitudinal sectional views showing the sectional structure of a memory cell transistor according to the first embodiment of the present invention and that of a memory cell transistor of a comparative example;

FIGS. 9A and 9B are longitudinal sectional views showing the sectional structure of a memory cell transistor according to the first embodiment of the present invention and that of a memory cell transistor of a comparative example;

FIGS. 18A and 18B are longitudinal sectional views each showing the sectional structure of elements in a predetermined step of a method of fabricating a NAND flash memory according to another embodiment of the present invention;

FIGS. 19A and 19B are longitudinal sectional views each showing the sectional structure of elements in a predetermined step of the method of fabricating the NAND flash memory;

DETAILED DESCRIPTION OF THE INVENTION

Embodiments of the present invention will be described below with reference to the accompanying drawings.

(1) First Embodiment

FIGS. 1A to 6B show a method of fabricating a memory cell transistor of a NAND flash memory according to the first embodiment of the present invention. Of FIGS. 1A to 5B, each of FIGS. 1A, 2A, 3A, 4A, and 5A is a longitudinal sectional view, cut along a bit line, of elements in a predetermined step, and each of FIGS. 1B, 2B, 3B, 4B, and 5B is a longitudinal sectional view, cut along a word line, of elements in a predetermined step.

Figure 1A:
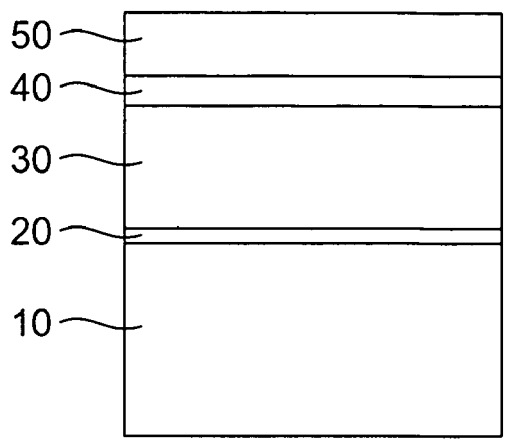
FIGS. 1A and 1B are longitudinal sectional views each showing the sectional structure of elements in a predetermined step of a method of fabricating a NAND flash memory according to the first embodiment of the present invention.
Figure 1B:
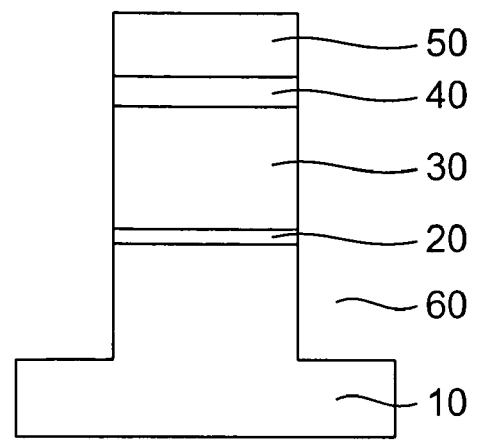

First, as shown in FIGS. 1A and 1B, a silicon oxynitride film (SiON) film 20 about 10 nm thick serving as a tunnel insulating film is formed by thermal oxidation and thermal nitriding on a semiconductor substrate 10 into which a predetermined impurity is doped. After that, a polysilicon layer 30 about 150 nm thick serving as a floating gate electrode and a stopper film 40 are sequentially deposited by low-pressure CVD (Chemical Vapor Deposition), and a mask material 50 is formed by coating.

The mask material 50, stopper film 40, polysilicon layer 30, and silicon oxynitride (SiON) film 20 are sequentially patterned by lithography and RIE (Reactive Ion Etching). In addition, the mask material 50 is used as a mask to etch the semiconductor substrate 10, thereby forming an element isolation trench 60 about 150 nm deep from the surface of the semiconductor substrate 10.

Figure 2A:
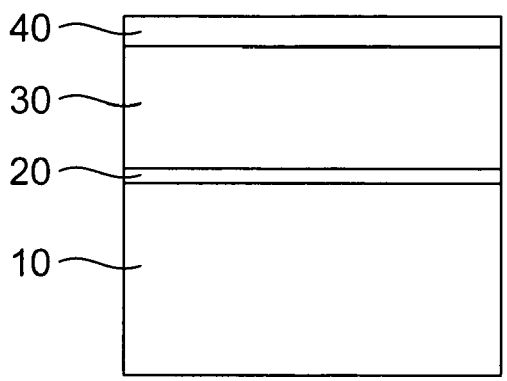
FIGS. 2A and 2B are longitudinal sectional views each showing the sectional structure of elements in a predetermined step of the method of fabricating the NAND flash memory.
Figure 2B:
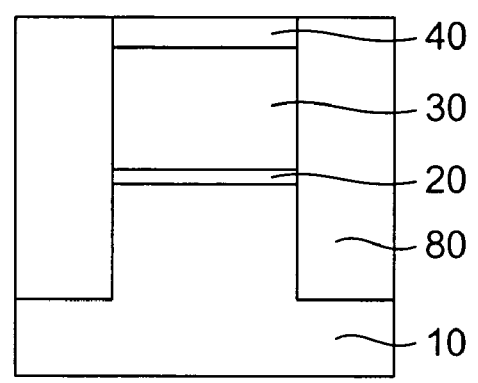

As shown in FIGS. 2A and 2B, a silicon oxide film (not shown) about 5 nm thick is formed in an exposed region of the semiconductor substrate 10 by thermal oxidation. After that, the semiconductor substrate 10 is loaded into a batch type deposition/modification apparatus 70 shown in FIG. 7 which is a processing chamber having a single processing vessel and is called a furnace. In the deposition/modification apparatus 70, a TEOS film 80 about 400 nm thick serving as an element isolation insulating film is deposited by plasma CVD at a temperature of 650° C. on all the surfaces of the semiconductor substrate 10 and mask material 50 so as to be embedded in the element isolation trench 60. Note that the deposition/modification apparatus 70 has an exhausting mechanism and gas supply source (neither is shown), and can form a desired ambient by using them.

In this embodiment, the TEOS film 80 is deposited as an element isolation insulating film. However, it is also possible to deposit a silicon oxide film such as HTO (High Temperature Oxide), BPSG (Borophosphosilicate Glass), PSG (Phosphosilicate Glass), or BSG (Boron-Silicate Glass). An insulating film such as polysilazane may also be formed by coating.

When the TEOS film 80 is used as an element isolation insulating film as in this embodiment, the TEOS film 80 must be densified by annealing at a high temperature in order to improve the reliability of the TEOS film 80 as an element isolation insulating film.

Unfortunately, the deposition/modification apparatus 70 in which the TEOS film 80 is deposited cannot perform any high-temperature annealing. Therefore, it is necessary to once remove the semiconductor substrate 10 from the deposition/modification apparatus 70, load the semiconductor substrate 10 into an annealing apparatus 90 shown in FIG. 7 which can perform high-temperature annealing, and density the TEOS film 80 by high-temperature annealing in the annealing apparatus 90.

If, however, the semiconductor substrate 10 is exposed to the atmosphere after being removed from the deposition/modification apparatus 70 and before being loaded into the annealing apparatus 90, the TEOS film 80 absorbs water, i.e., causes moisture absorption.

Consequently, the absorbed water diffuses into the silicon oxynitride (SiON) film 20 serving as a tunnel insulating film, and deteriorates the reliability of this tunnel insulating film.

In this embodiment, therefore, in the deposition/modification apparatus 70 in which the TEOS film 80 is deposited, the TEOS film 80 is modified, e.g., densified by annealing in a nitrogen ambient at a temperature of, e.g., 800° C. for 60 min, to such an extent that the TEOS film 80 does not absorb water when the semiconductor substrate 10 is exposed to the atmosphere.

Note that the temperature of this annealing is desirably higher than the temperature when the TEOS film 80 is deposited, but the densifying effect can be obtained even at the same temperature as when the TEOS film 80 is deposited if annealing is performed for 30 min or more. Annealing may also be performed in an oxidizing ambient, and the annealing time may also be about 30 min.

Figure 7:
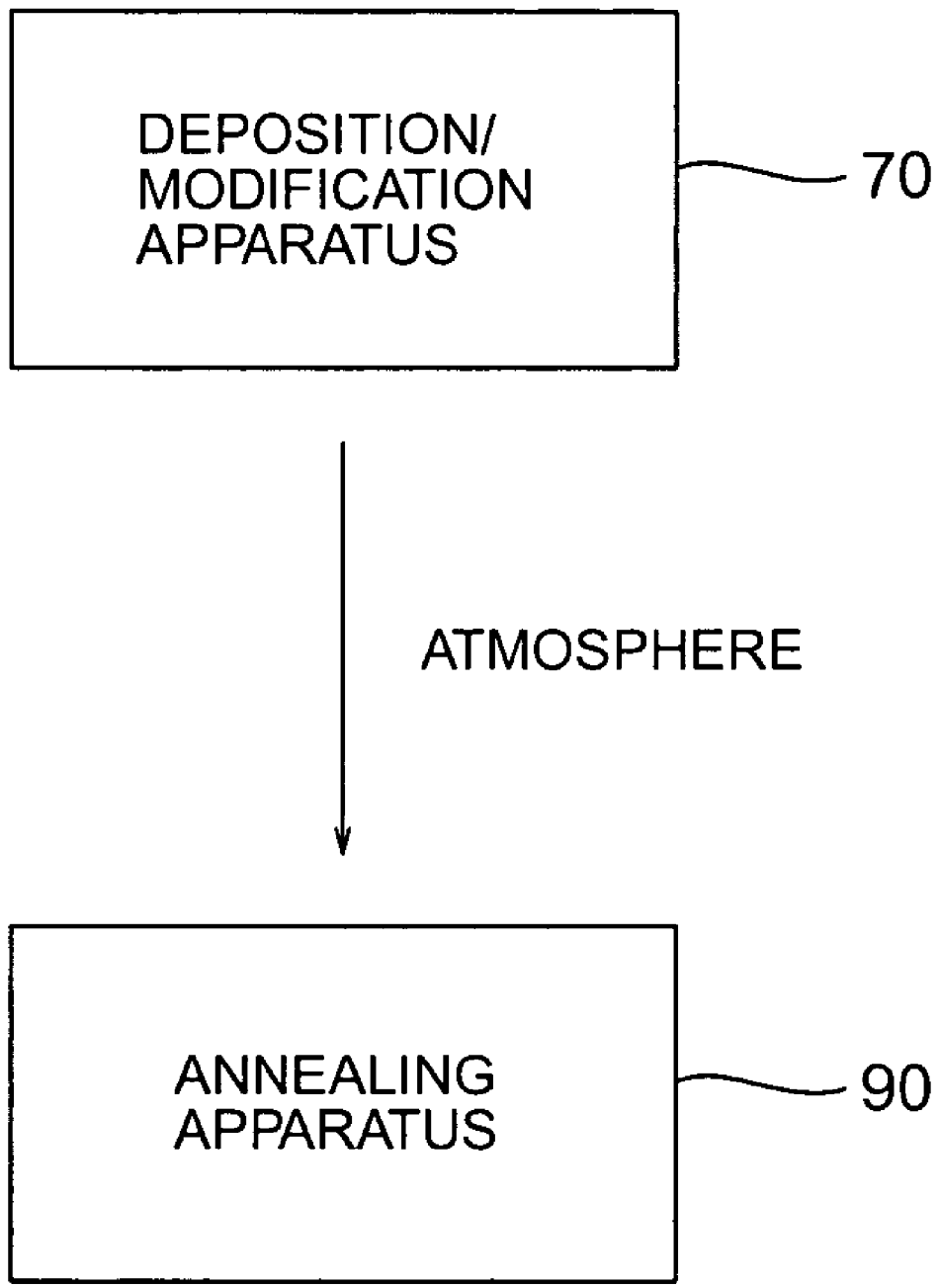
FIG. 7 is a block diagram showing the arrangement of a batch type deposition/modification apparatus and annealing apparatus.

After that, the semiconductor substrate 10 is removed from the deposition/modification apparatus 70, and loaded into the annealing apparatus 90 shown in FIG. 7. Although the semiconductor substrate 10 is exposed to the atmosphere during this transfer, moisture absorption by the TEOS film 80 can be suppressed.

In the annealing apparatus 90, the TEOS film 80 is annealed in an oxidizing ambient at, e.g., about 1,035° C. which is higher than the temperature of annealing for suppressing moisture absorption by the TEOS film 80, without performing any liquid chemical treatment for avoiding moisture absorption by the TEOS film 80, thereby densifying the TEOS film 80 to such an extent that the TEOS film 80 can ensure the reliability as an element isolation insulating film. After that, the semiconductor substrate 10 is removed from the annealing apparatus 90.

Then, CMP (Chemical Mechanical Polishing) is used to polish the TEOS film 80 and planarize its surface by using the stopper film 40 as a stopper, thereby removing the mask material 50 and exposing the stopper film 40.

Figure 3A:
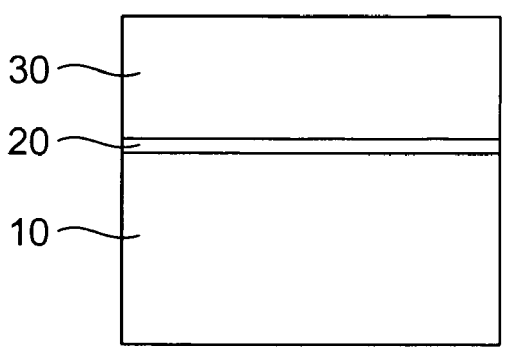
FIGS. 3A and 3B are longitudinal sectional views each showing the sectional structure of elements in a predetermined step of the method of fabricating the NAND flash memory.
Figure 3B:
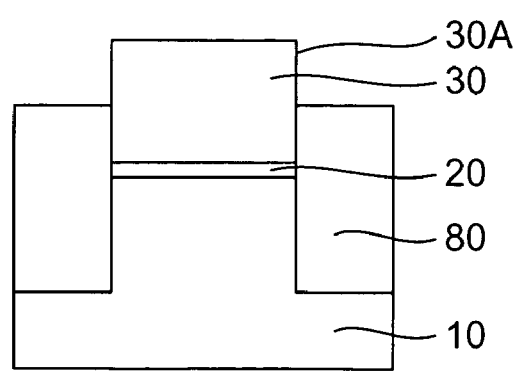

As shown in FIGS. 3A and 3B, a phosphoric acid solution is used to etch away the exposed stopper film 40, and a predetermined amount of the surface portion of the TEOS film 80 is removed by etching using a dilute hydrofluoric acid solution, thereby exposing side surfaces 30A of the polysilicon layer 30 by about 70 nm.

As shown in FIGS. 4A and 4B, an ONO film (a stacked film in which a silicon oxide film, silicon nitride film, and silicon oxide film are stacked) about 15 nm thick serving as an inter-electrode insulating film is deposited on all the surfaces of the TEOS film 80 and polysilicon layer 30 by low-pressure CVD.

After that, low-pressure CVD is performed to deposit a conductive layer 110 about 100 nm thick which serves as a control gate electrode and has a two-layered structure including, e.g., a polysilicon layer and tungsten (W) silicide layer, and to deposit a mask material 120.

Then, the mask material 120, conductive layer 110, ONO film 100, polysilicon layer 30, and silicon oxynitride (SiON) film 20 are sequentially patterned by lithography and RIE, thereby forming a slit 130. In this manner, a gate electrode in which a floating gate electrode made of the polysilicon layer 30 and a control gate electrode made of the conductive layer 110 are stacked is formed.

As shown in FIGS. 5A and 5B, a silicon oxide film 140 serving as an electrode sidewall insulating film is formed by thermal oxidation and low-pressure CVD on the exposed surfaces of the semiconductor substrate 10, silicon oxynitride (SiON) film 20, polysilicon layer 30, ONO film 100, conductive layer 110, and mask material 120. After that, a source region 150A and drain region 150B are formed by ion implantation Recently, a method by which a silicon oxide film having a relative dielectric constant lower than that of a silicon nitride film is used as an inter-cell embedded insulating film is proposed. However, a silicon oxide film readily absorbs water, i.e., has moisture absorption. This poses the problem that a silicon oxide film absorbs water during the fabrication process, and the absorbed water diffuses into a tunnel insulating film and inter-electrode insulating film and deteriorates the reliability of the tunnel insulating film or inter-electrode insulating film.

In this embodiment, therefore, in the same manner as when the TEOS film 80 as an element isolation insulating film is deposited, the semiconductor substrate 10 is loaded into the batch type deposition/modification apparatus 70 called a furnace shown in FIG. 7. In the deposition/modification apparatus 70, a TEOS film 160 about 20 nm thick serving as an inter-cell embedded insulating film is deposited on the entire surface of the silicon oxide film 140 so as to be embedded in the slit 130 by low-pressure CVD at a temperature of 650° C.

In this embodiment, the TEOS film 160 is deposited as an inter-cell embedded insulating film. However, it is also possible to deposit a silicon oxide film such as HTO, BPSG, PSG, or BSG. An insulating film such as polysilazane may also be formed by coating.

Subsequently, in the deposition/modification apparatus 70 in which the TEOS film 160 is deposited, the TEOS film 160 is modified, e.g., densified by annealing in a nitrogen ambient at a temperature of, e.g., 800° C. for 60 min, to such an extent that the TEOS film 160 does not absorb water when the semiconductor substrate 10 is exposed to the atmosphere.

Note that the temperature of this annealing is desirably higher than the temperature when the TEOS film 160 is deposited, but the densifying effect can be obtained even at the same temperature as when the TEOS film 160 is deposited if annealing is performed for 30 min or more. Annealing may also be performed in an oxidizing ambient, and the annealing time may also be about 30 min.

After that, the semiconductor substrate 10 is removed from the deposition/modification apparatus 70, and loaded into the annealing apparatus 90 shown in FIG. 7. Although the semiconductor substrate 10 is exposed to the atmosphere during this transfer, moisture absorption by the TEOS film 160 can be suppressed.

In the annealing apparatus 90, the TEOS film 160 is annealed in an oxidizing ambient at, e.g., about 1,035° C. which is higher than the temperature of annealing for suppressing moisture absorption by the TEOS film 160, without performing any liquid chemical treatment for avoiding moisture absorption by the TEOS film 160, thereby densifying the TEOS film 160 to such an extent that the TEOS film 160 can ensure the reliability as an element isolation insulating film. After that, the semiconductor substrate 10 is removed from the annealing apparatus 90.

Note that if the TEOS film 160 is deposited with a large film thickness, the TEOS film 160 cannot be well densified, so the TEOS film 160 must be separately deposited and annealed twice. In this embodiment, therefore, the TEOS film 160 is so deposited as to be embedded in the slit 130 and have a desired film thickness, and the annealing described above is performed again. The first deposition film thickness of the TEOS film 160 is desirably 3 to 30 nm.

A silicon nitride film 170 serving as an interlayer dielectric film is deposited on the entire surface of the TEOS film 160 by low-pressure CVD. In addition, interconnecting layers (not shown) and the like are formed to fabricate the memory cell transistor of the NAND flash memory.

Figure 6A:
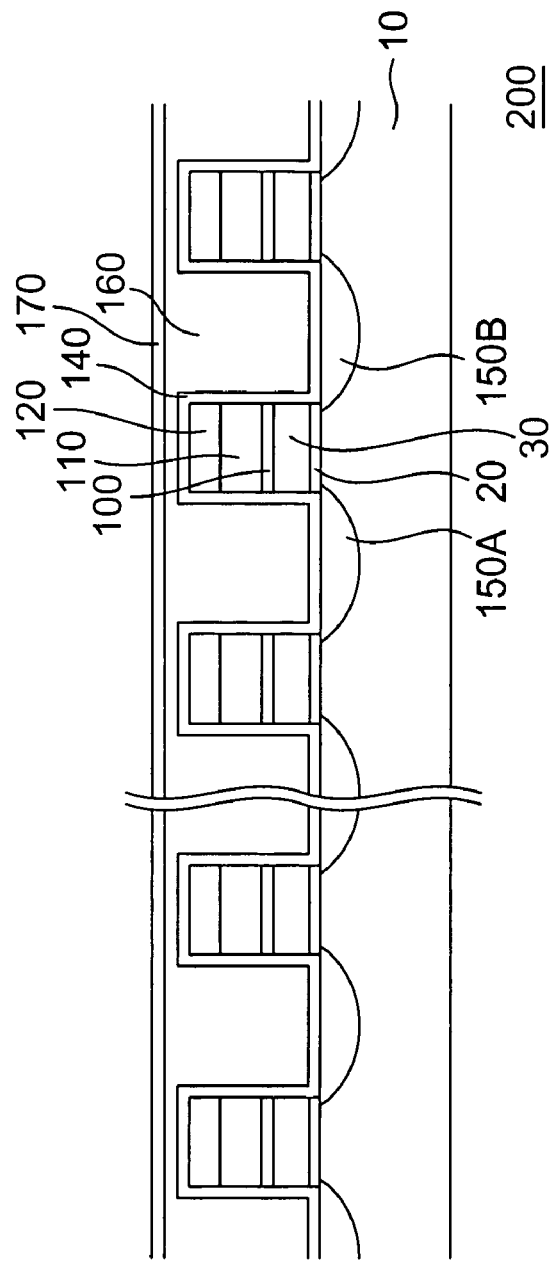
FIGS. 6A and 6B are longitudinal sectional views each showing the sectional structure of elements in a predetermined step of the method of fabricating the NAND flash memory.
Figure 6B:
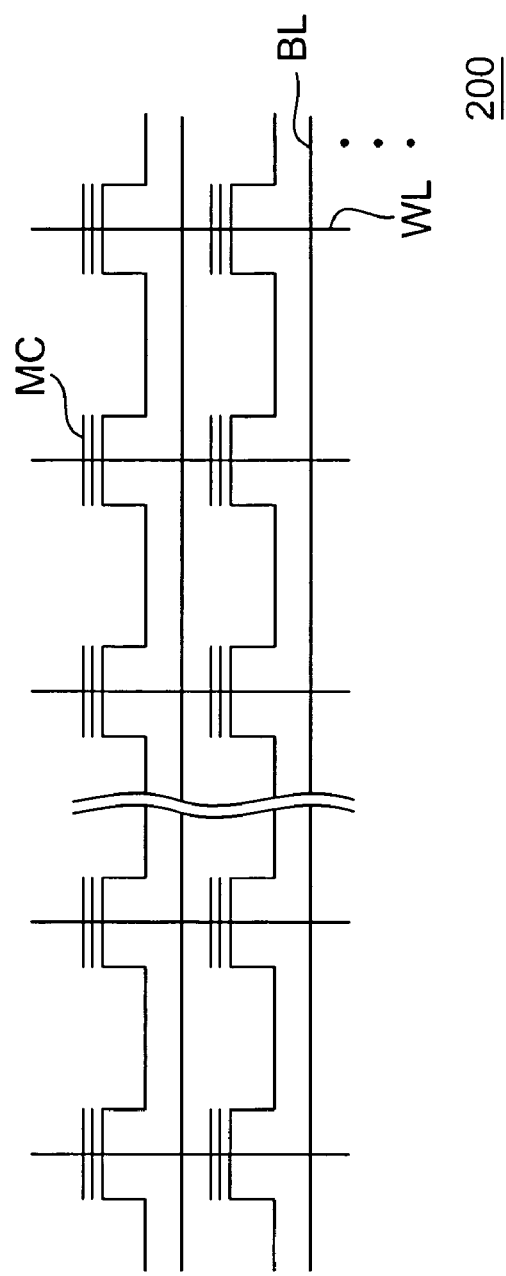

FIG. 6A shows the longitudinal section when a NAND flash memory 200 in which memory cell transistors MC fabricated by the above method are arranged in a matrix is cut along a bit line BL. FIG. 6B shows the circuit diagram, which corresponds to the longitudinal section shown in FIG. 6A, of the NAND flash memory 200.

In the NAND flash memory 200 as shown in FIGS. 6A and 6B, the source regions 150A and drain regions 150B of a plurality of memory cell transistors MC are connected in series between two selection transistors (not shown), one of these selection transistors is connected to the bit line BL, and the other is connected to a source line (not shown). Also, a word line WL is connected to the control gate electrode made of the conductive layer 110 of each memory cell transistor MC.

In this embodiment, the NAND flash memory 200 is fabricated as a flash memory. However, it is also possible to fabricate any of various flash memories, e.g., NOR and AND flash memories, having a structure in which a floating gate electrode and control gate electrode are stacked. Furthermore, a structure including three or more stacked layers each made up of an insulating film and gate electrode may also be formed.

FIG. 8A shows the arrangement of elements when a TEOS film 80 serving as an element isolation insulating film is deposited, densified, and further densified after being exposed to the atmosphere by the fabrication method according to this embodiment.

FIG. 8B shows the arrangement of elements, as a comparative example, when a TEOS film 210 is deposited and densified not before but after being exposed to the atmosphere.

When the TEOS film 210 is exposed to the atmosphere after being deposited as in the comparative example, the TEOS film 210 absorbs water. The absorbed water diffuses (arrows A10 in FIG. 8B) into a silicon oxynitride (SiON) film 20 serving as a tunnel insulating film, and deteriorates the reliability of this tunnel insulating film.

By contrast, in this embodiment, the TEOS film 80 is densified after being deposited and before being exposed to the atmosphere. This makes it possible to suppress moisture absorption even when the TEOS film 80 is exposed to the atmosphere. Accordingly, unlike in the comparative example, it is possible to prevent diffusion of the absorbed water into the silicon oxynitride film (SiON) film 20 serving as a tunnel insulating film, and suppress deterioration of the reliability of this tunnel insulating film.

FIG. 9A shows the arrangement of elements when a TEOS film 160 serving as an inter-cell embedded insulating film is deposited, densified, and further densified after being exposed to the atmosphere by the fabrication method according to this embodiment.

FIG. 9B shows the arrangement of elements, as a comparative example, when a TEOS film 220 is deposited and densified not before but after being exposed to the atmosphere.

When the TEOS film 220 is exposed to the atmosphere after being deposited as in the comparative example, the TEOS film 220 absorbs water. The absorbed water diffuses (arrows A20 and A30 in FIG. 9B) into a silicon oxynitride (SiON) film 20 serving as a tunnel insulating film and an ONO film 100 serving as an inter-electrode insulating film, and deteriorates the reliability of these tunnel insulating film and inter-electrode insulating film.

On the contrary, in this embodiment, the TEOS film 160 is densified after being deposited and before being exposed to the atmosphere. This makes it possible to suppress moisture absorption even when the TEOS film 160 is exposed to the atmosphere. Accordingly, unlike in the comparative example, it is possible to prevent diffusion of the absorbed water into the silicon oxynitride film (SiON) film 20 serving as a tunnel insulating film and the ONO film 100 serving as an inter-electrode insulating film, and suppress deterioration of the reliability of these tunnel insulating film and inter-electrode insulating film.

Note that when only the TEOS film 160 is embedded in the slit 130 as in this embodiment, the thickness of the TEOS film 160 becomes larger than that when the TEOS film and silicon nitride film are embedded in the slit 130. Therefore, if the TEOS film 160 absorbs water, the amount of absorbed water increases. This also increases the amount of absorbed water which diffuses into the tunnel insulating film and inter-electrode insulating film.

Conversely, this embodiment can suppress moisture absorption by the TEOS film 160. Therefore, even when the thickness of the TEOS film 160 increases, this does not increase the amount of absorbed water which diffuses into the tunnel insulating film and inter-electrode insulating film.

Especially when the TEOS film 160 or 80 is deposited in the slit 130 or element isolation trench 60 completely surrounded by the bottom surface and side surfaces, the absorbed water does not easily escape to the outside, and readily causes oxidation on the bottom surface and side surfaces when the densifying process is performed. This may worsen the controllability of the film thickness of the tunnel insulating film or inter-electrode insulating film.

Also, in peripheral transistors (transistors of peripheral circuits which drive the memory cell transistors MC) in which an impurity is implanted after the TEOS film 160 is deposited, oxidation by the absorbed water lowers the controllability of the thickness of an insulating film, or causes variations of the transistor characteristics. However, this embodiment can suppress the lowering of the film thickness controllability and the variations of the transistor characteristics.

Figure 10:
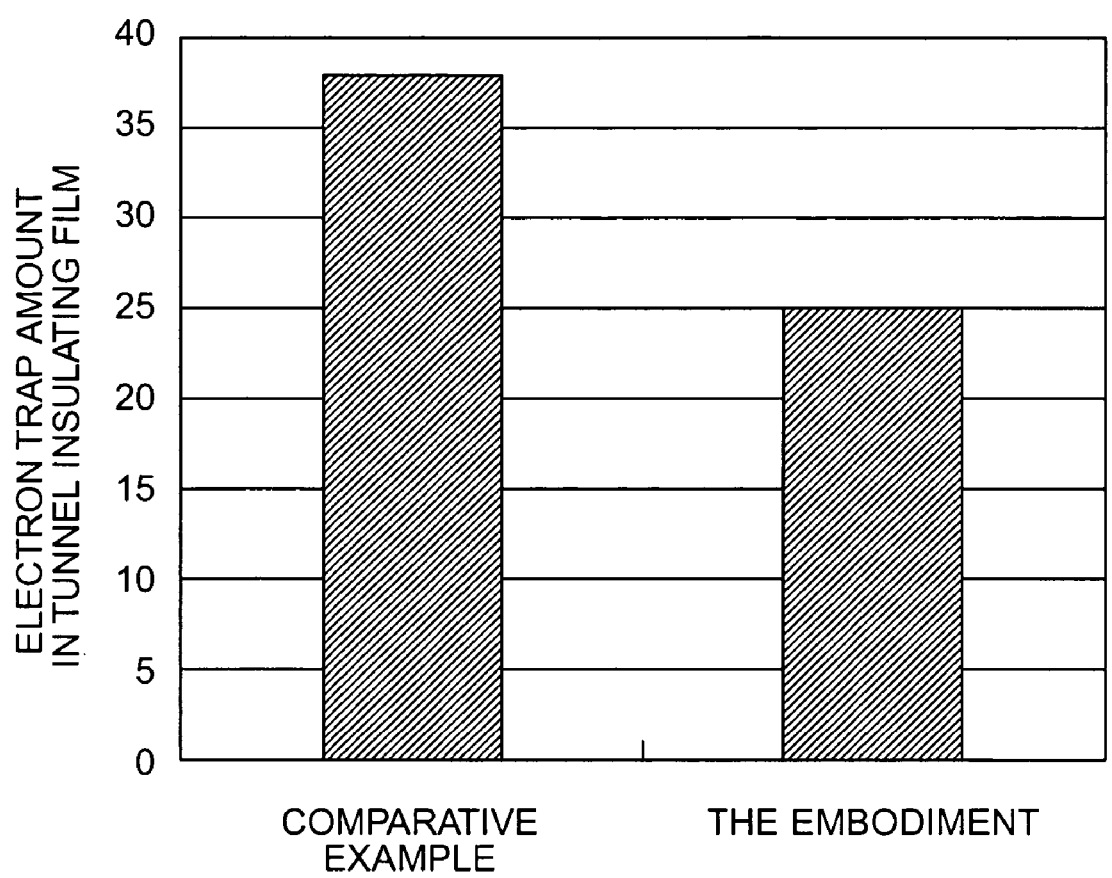
FIG. 10 is a graph showing the electron trap amount in a tunnel insulating film in each of the embodiment and comparative example.

FIG. 10 shows an electron trap amount produced in a tunnel insulating film when a predetermined voltage is applied to the tunnel insulating film in each of the comparative example and this embodiment. An electron trap is a defective portion, called a dangling bond, which captures an electron. The ordinate in FIG. 10 indicates the produced amount of electron traps by the voltage value. Since the electron trap fluctuates the gate threshold voltage, the electron trap amount is desirably as small as possible.

As shown in FIG. 10, this embodiment can make the electron trap amount produced in the tunnel insulating film smaller than that in the comparative example, and thereby suppress deterioration of the reliability of the tunnel insulating film.

Note that the memory cell transistor fabrication method according to this embodiment can be applied to generations having a cell size of 100 nm or less.

When annealing is executed at, e.g., 1,000° C. or more in the deposition/modification apparatus 70, it takes a long time to raise the temperature, and this applies a large thermal load on the semiconductor substrate 10. Therefore, when an insulating film is deposited by the deposition/modification apparatus 70 as in the first embodiment described above, the limitation on the processing temperature of the deposition/modification apparatus 70 makes it impossible to perform high-temperature annealing at 1,000° C. or more. Accordingly, annealing performed in the same closed apparatus as in this embodiment is very useful.

Figure 11:
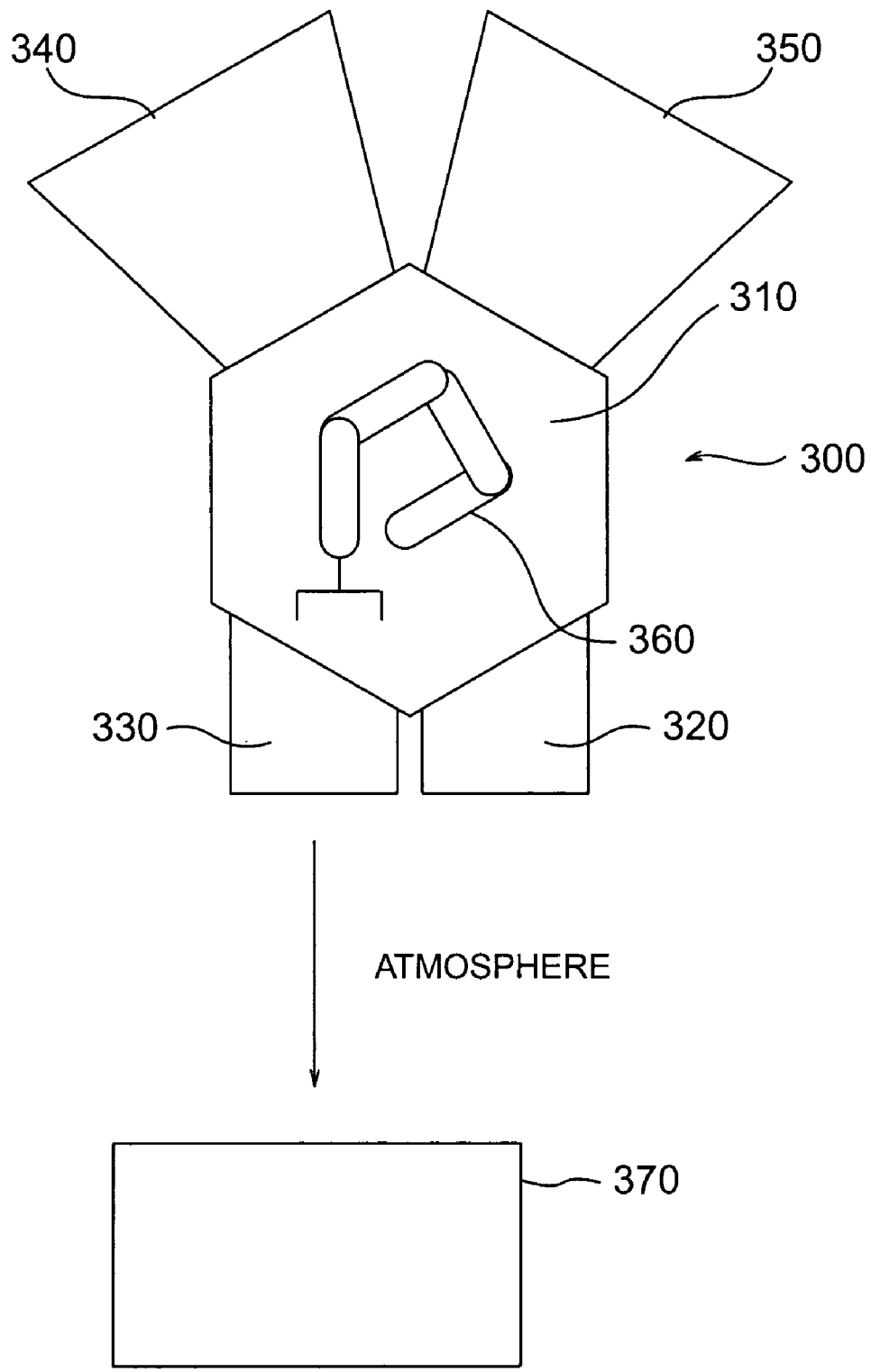
FIG. 11 is a block diagram showing the arrangement of a single-wafer deposition/modification apparatus and annealing apparatus.

Note that the first embodiment described above is merely an example, and hence does not limit the present invention. For example, in the batch type deposition/modification apparatus 70 called a furnace, the TEOS films 80 and 160 are deposited, and annealing is performed to suppress moisture absorption by the TEOS films 80 and 160. However, it is also possible to perform deposition of the TEOS films 80 and 160 and annealing for suppressing moisture absorption in a single-wafer type deposition/modification apparatus 300 called a cluster chamber shown in FIG. 11.

A transfer chamber 310 is placed near the central portion of the deposition/modification apparatus 300 as a processing chamber called a cluster chamber. A loading chamber 320, an unloading chamber 330, a deposition chamber 340 as a processing vessel, and an annealing chamber 350 as another processing vessel are arranged around the transfer chamber 310.

A transfer mechanism 360 which is an arm or the like is placed near the central portion of the transfer chamber 300, and transfers the semiconductor substrate 10 between the chambers 320, 330, 340, and 350. Also, the transfer chamber 310 has an exhausting mechanism and gas supply source (neither is shown), and a desired ambient is formed in the transfer chamber 310 by using them. In this manner, the semiconductor substrate 10 can be transferred to a desired chamber without being exposed to the atmosphere.

That is, the transfer mechanism 360 of the transfer chamber 310 transfers the semiconductor substrate 10 loaded from the loading chamber 320 to the deposition chamber 340, and an TEOS film 80 or 160 is deposited in the deposition chamber 340. After that, the semiconductor substrate 10 is transferred from the deposition chamber 340 to the annealing chamber 350 via the transfer chamber 310. In the annealing chamber 350, the TEOS film 80 or 160 is densified by annealing to such an extent that moisture absorption by the TEOS film 80 or 160 can be suppressed.

Then, the semiconductor substrate 10 is transferred from the annealing chamber 350 to the unloading chamber 330 via the transfer chamber 360, and thereby removed from the deposition/modification apparatus 300. The semiconductor substrate 10 is loaded into an annealing apparatus 370 shown in FIG. 13. Although the semiconductor substrate 10 is exposed to the atmosphere during this transfer as in the above first embodiment, moisture absorption by the TEOS film 80 or 160 can be suppressed.

In the annealing apparatus 370, the TEOS film 80 or 160 is densified by annealing at a high temperature to such an extent that the TEOS film 80 or 160 can assure the reliability as an element isolation insulating film or inter-cell embedded insulating film.

(2) Second Embodiment

Figure 12:
FIG. 12 is a longitudinal sectional view showing the sectional structure of elements in a predetermined step of a method of fabricating a MOSFET according to the second embodiment of the present invention.

FIGS. 12 to 16 show a method of fabricating a MOSFET according to the second embodiment of the present invention. First, as shown in FIG. 12, element isolation insulating films 410A and 410B are formed on a semiconductor substrate 400, and a native oxide film formed on the semiconductor substrate 400 is removed by cleaning using dilute hydrofluoric acid.

Figure 13:
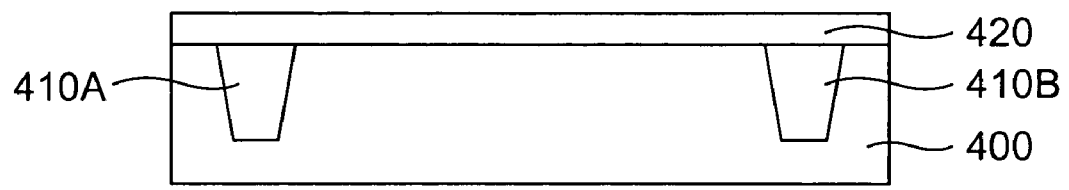
FIG. 13 is a longitudinal sectional view showing the sectional structure of elements in a predetermined step of a method of fabricating a MOSFET according to the second embodiment.
Figure 14:
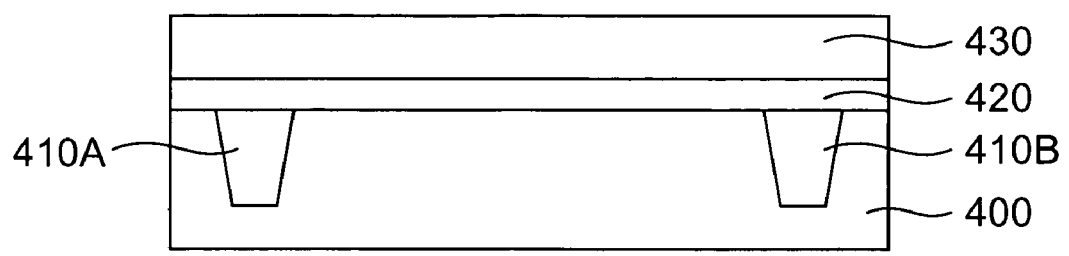
FIG. 14 is a longitudinal sectional view showing the sectional structure of elements in a predetermined step of a method of fabricating a MOSFET according to the second embodiment.

As shown in FIG. 13, an insulating film 420 serving as a gate insulating film is formed on the surface of the semiconductor substrate 400. After that, as shown in FIG. 14, a polysilicon layer 430 serving as a gate electrode is deposited on the insulating film 420 by low-pressure CVD.

Figure 15:
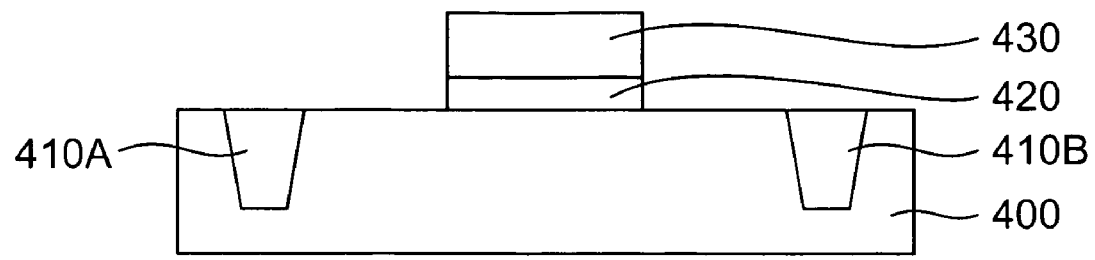
FIG. 15 is a longitudinal sectional view showing the sectional structure of elements in a predetermined step of a method of fabricating a MOSFET according to the second embodiment.

As shown in FIG. 15, the polysilicon layer 430 and insulating film 420 are sequentially patterned by lithography and RIE, thereby forming a gate insulating film made of the insulating film 420 and a gate electrode made of the polysilicon layer 430.

Figure 16:
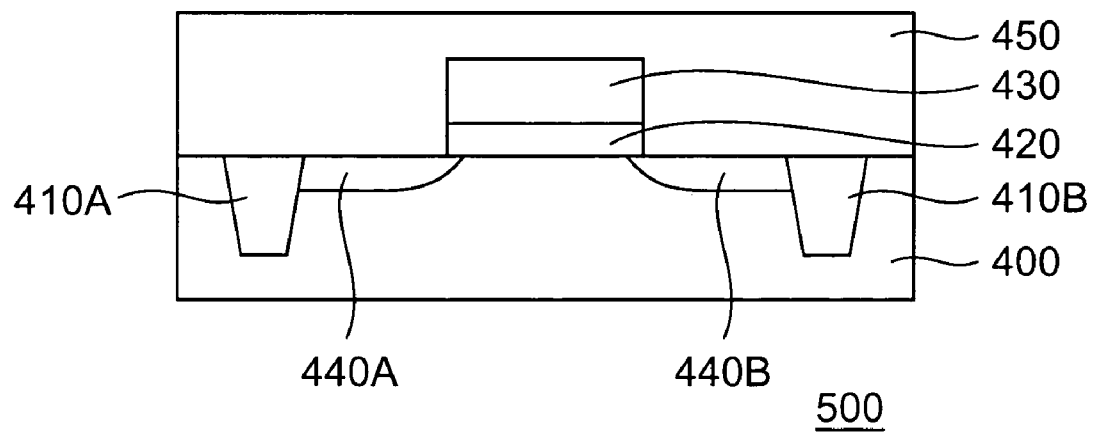
FIG. 16 is a longitudinal sectional view showing the sectional structure of elements in a predetermined step of a method of fabricating a MOSFET according to the second embodiment.

As shown in FIG. 16, a source region 440A and drain region 440B are formed by ion implantation.

After that, the semiconductor substrate 400 is loaded into a batch type deposition/modification apparatus 70 shown in FIG. 7 which is a processing chamber having a single processing vessel and is called a furnace. In the deposition/modification apparatus 70, a TEOS film 450 serving as an interlayer dielectric film is deposited on the semiconductor substrate 400 and polysilicon layer 430 at a temperature of 650° C. to 700° C. Note that the deposition/modification apparatus 70 has an exhausting mechanism and gas supply source (neither is shown), and can form a desired ambient by using them.

In this embodiment, the TEOS film 450 is deposited as an interlayer dielectric film. However, it is also possible to deposit a silicon oxide film such as HTO, BPSG, PSG, or BSG. An insulating film such as polysilazane may also be formed by coating.

As in the first embodiment, in the deposition/modification apparatus 70 in which the TEOS film 450 is deposited, the TEOS film 450 is modified, e.g., densified by annealing in a nitrogen ambient at a temperature of, e.g., 800° C., to such an extent that the TEOS film 450 does not absorb water when the semiconductor substrate 400 is exposed to the atmosphere.

Note that, as in the first embodiment, the temperature of this annealing need only be, e.g., 700° C. to 900° C. which is higher than the temperature when the TEOS film 450 is deposited. However, the temperature is desirably as high as possible because the densifying effect increases. Annealing may also be performed in an oxidizing ambient.

After that, the semiconductor substrate 400 is removed from the deposition/modification apparatus 70, and loaded into an annealing apparatus 90 shown in FIG. 7. Although the semiconductor substrate 400 is exposed to the atmosphere during this transfer, it is possible to suppress the TEOS film 450 from absorbing water, i.e., suppress moisture absorption by the TEOS film 450.

In the annealing apparatus 90, the TEOS film 450 is annealed at, e.g., about 1,035° C. which is higher than the temperature of annealing for suppressing moisture absorption by the TEOS film 450, without performing any liquid chemical treatment, thereby densifying the TEOS film 450 to such an extent that the TEOS film 450 can assure the reliability as an interlayer dielectric film. After that, the semiconductor substrate 400 is removed from the annealing apparatus 90. Interconnecting layers (not shown) and the like are then formed to fabricate a MOSFET 500.

Figure 17B:
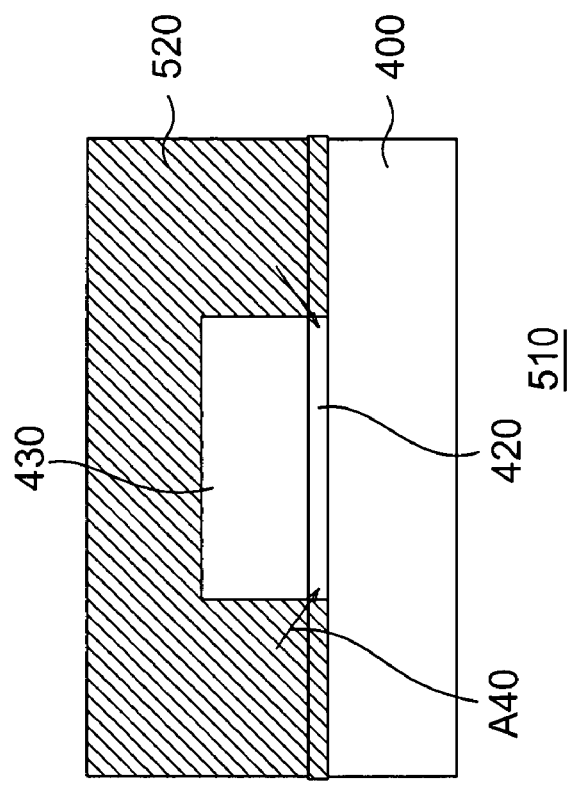
FIGS. 17A and 17B are longitudinal sectional views showing the sectional structure of the MOSFET according to the second embodiment of the present invention and that of a MOSFET of a comparative example.
Figure 17A:
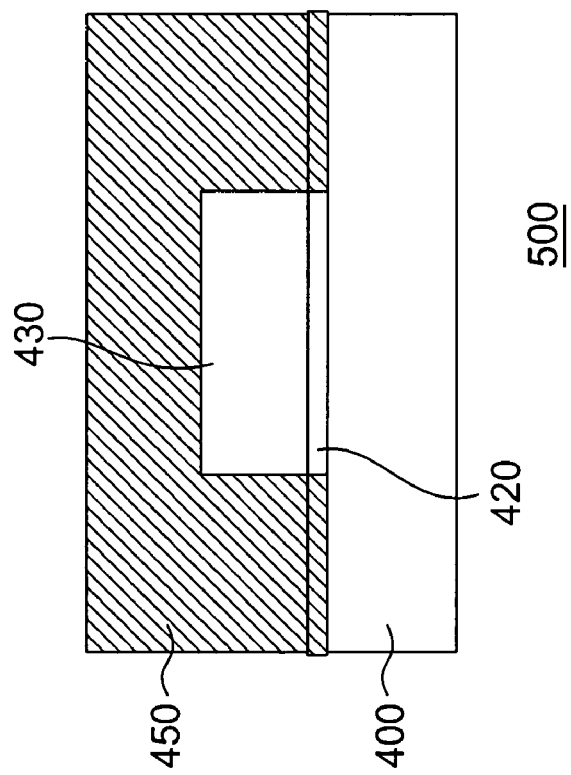

FIG. 17A shows the structure of the MOSFET 500 according to this embodiment. FIG. 17B shows the structure of a MOSFET 510 as a comparative example in which a TEOS film 520 is not densified after being deposited, but densified after being exposed to the atmosphere.

When the TEOS film 520 is exposed to the atmosphere after being deposited as in the comparative example, the TEOS film 520 absorbs water. This adsorbed water diffuses (arrows A40 in FIG. 17B) into an insulating film 420 serving as a gate insulating film, and deteriorates the reliability of this gate insulating film, e.g., deteriorates the hot carrier resistance (the property which suppresses the formation of defects by hot carriers) of the gate insulating film.

By contrast, in this embodiment, the TEOS film 450 is densified after being deposited and before being exposed to the atmosphere, so moisture absorption can be suppressed even when the TEOS film 450 is exposed to the atmosphere. Accordingly, unlike in the comparative example, no absorbed water diffuses into the insulating film 420 serving as a gate insulating film, so deterioration of the reliability of the gate insulating film can be suppressed.

Note that the second embodiment described above is merely an example, and hence does not limit the present invention. For example, in the batch type deposition/modification apparatus 70 called a furnace, the TEOS film 450 is deposited, and annealing is performed to suppress moisture absorption by the TEOS film 450. However, it is also possible to perform deposition of the TEOS film 450 and annealing for suppressing moisture absorption in a single-wafer type deposition/modification apparatus 300 called a cluster chamber shown in FIG. 11.

In this case, as in the other embodiment of the first embodiment, in the deposition/modification apparatus 300 which is a processing chamber having a plurality of processing vessels, the TEOS film 450 is deposited and densified to such an extent that moisture absorption by the TEOS film 450 can be suppressed. After that, the semiconductor substrate 400 is removed from the deposition/modification apparatus 300, and loaded into an annealing apparatus 370 shown in FIG. 11. Although the semiconductor substrate 400 is exposed to the atmosphere during this transfer, moisture absorption by the TEOS film 450 can be suppressed.

In the annealing apparatus 370, the TEOS film 450 is densified by annealing at a high temperature to such an extent that the TEOS film 450 can assure the reliability as an interlayer dielectric film.

(3) Other Embodiments

Note that the first and second embodiments described above are merely examples, and hence do not limit the present invention. For example, oxygen radical processing may also be performed at a temperature of 400° C. as the modification process of suppressing moisture absorption by the TEOS films 80, 160, and 450. In this case, although the temperature need only range from room temperature to 900° C., the temperature is desirably as high as possible because the modification effect improves.

The oxygen radical is, e.g., neutral atomic oxygen or excited molecular oxygen, and is generated by changing a gas mixture, which is obtained by diluting oxygen gas to 1% to 100% with argon gas, into plasma by microwaves. The TEOS films 80, 160, and 450 are modified by oxygen radical processing which causes the TEOS films 80, 160, and 450 to absorb this oxygen radical.

Note that this oxygen radical processing may also be performed in an ambient in which the oxygen radical and oxygen ion are mixed. It is also possible to dilute oxygen gas with any of various diluent gases such as helium, neon, krypton, and xenon. Furthermore, the ratio of oxygen gas may also be increased by reducing the amount diluted by the diluent gas, or the ratio of oxygen gas may also be set at 100% without any dilution by the diluent gas.

Although hydrogen gas may also be added to the gas mixture, the addition amount is preferably as low as 1% to 10%. The gas mixture may also be changed into plasma by high frequency radiation, instead of microwave radiation. NO gas or $N_2O$ gas may also be changed into plasma. The oxygen radical may also be generated by the reaction of oxygen gas with hydrogen gas.

Nitrogen radical processing may also be performed by generating nitrogen radical by changing a gas mixture of nitrogen gas and a diluent gas or 100% nitrogen gas into plasma by the same method as for generating the oxygen radical. It is also possible to simultaneously perform the oxygen radical processing and nitrogen radical processing by simultaneously generating the oxygen radical and nitrogen radical by changing a gas mixture of oxygen gas and nitrogen gas into plasma.

Furthermore, as the modification process of suppressing moisture absorption by the TEOS films 80, 160, and 450, it is also possible to perform an ultraviolet radiation process of irradiating the TEOS films 80, 160, and 450 with ultraviolet light in a nitrogen ambient at room temperature.

Note that a light radiation process of radiating any of various types of light such as visible light, infrared light, and white light may also be performed.

In this case, a point light source is placed above the semiconductor substrates 10 and 400, and the semiconductor substrates 10 and 400 are irradiated, by uniform intensity, with light emitted from this point light source by using a light reflecting plate. It is also possible to arrange a plurality of light sources over the semiconductor substrates 10 and 400, and irradiate the semiconductor substrates 10 and 400, by uniform intensity, with light emitted from these light sources.

Although the temperature need only range from room temperature to 900° C., the temperature is desirably as high as possible because the modification effect improves. The light radiation process may also be performed in an oxygen ambient or in a vacuum, instead of a nitrogen ambient.

In the first embodiment, as shown in FIGS. 4A and 4B, the slit 130 is formed by sequentially patterning the mask material 120, conductive layer 110, ONO film 100, polysilicon layer 30, and silicon oxynitride (SiON) film 20. However, as shown in FIGS. 18A and 18B, the slit 130 may also be formed by sequentially patterning the mask material 120, conductive layer 110, ONO film 100, and polysilicon layer 30, without etching the silicon oxynitride (SiON) film 20, thereby forming a gate electrode in which the floating gate electrode made of the polysilicon layer 30 and a control gate electrode made of the conductive layer 110 are stacked.

In this case, as shown in FIGS. 19A and 19B, after a source region 150A and drain region 150B are formed, a TEOS film 160 serving as an inter-cell embedded insulating film is deposited on the mask material 120 and silicon oxynitride (SiON) film 20 so as to be embedded in the slit 130. In addition, the TEOS film 160 is sequentially modified and annealed as in the first embodiment.

Figure 20:
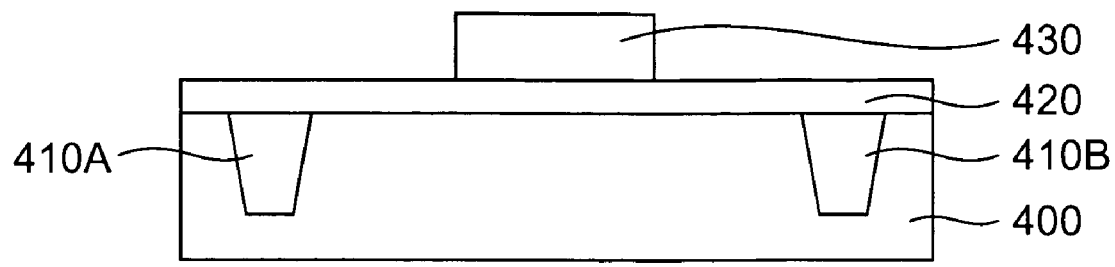
FIG. 20 is a longitudinal sectional view showing the sectional structure of elements in a predetermined step of a method of fabricating a MOSFET according to still another embodiment of the present invention.

In the second embodiment, as shown in FIG. 15, the polysilicon layer 430 and insulating film 420 are sequentially patterned. However, as shown in FIG. 20, it is also possible to pattern only the polysilicon layer 420 without etching the insulating film 420, thereby forming a gate insulating film made of the insulating film 420 and a gate electrode made of the polysilicon layer 430.

Figure 21:
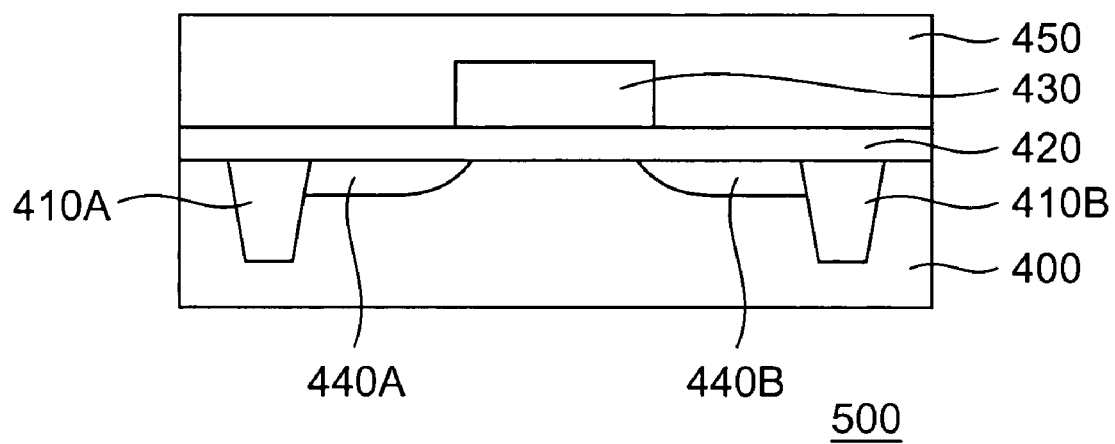
FIG. 21 is a longitudinal sectional view showing the sectional structure of elements in a predetermined step of the method of fabricating the MOSFET.

In this case, as shown in FIG. 21, after a source region 440A and drain region 440B are formed, a TEOS film 450 serving as an interlayer dielectric film is deposited on the insulating film 420 and polysilicon layer 430. In addition, the TEOS film 450 is sequentially modified and annealed as in the second embodiment.

As has been explained above, the semiconductor device fabrication method of each of the above embodiments can suppress deterioration of the reliability of an insulating film.

What is claimed is:

1. A semiconductor device fabrication method comprising:
    forming a first insulating film on a semiconductor substrate;
    forming a conductive layer on the first insulating film;
    exposing a portion of the first insulating film by removing a portion of the conductive layer;
    forming a second insulating film on the exposed surface of the first insulating film in a first processing chamber isolated from an outside atmosphere;
    performing an oxygen radical process using oxygen radical generated by changing a gas containing oxygen into a plasma, a nitrogen radical process using nitrogen radical generated by changing a gas containing nitrogen into a plasma, or an oxygen radical and nitrogen radical process using oxygen radical and nitrogen radical generated by changing a gas containing oxygen and nitrogen into a plasma as a modification process on the second insulating film in the first processing chamber to prevent the second insulating film from absorbing water when the semiconductor substrate is exposed to the outside atmosphere, and then unloading the semiconductor substrate from the first processing chamber to the outside atmosphere; and annealing the second insulating film in a second processing chamber.

2. A method according to claim 1, wherein the first processing chamber comprises a single processing vessel.

3. A method according to claim 1, wherein the second insulating film contains silicon and oxygen, or silicon and nitrogen.

4. A method according to claim 1, wherein when the first insulating film is to be exposed by removing a portion of the conductive layer, a side surface of the first insulating film is exposed by removing a portion of the first conductive layer and a portion of the first insulating film.

5. A method according to claim 4, wherein the first processing chamber comprises a single processing vessel.

6. A method according to claim 4, wherein the second insulating film contains silicon and oxygen, or silicon and nitrogen.

7. A method according to claim 1, wherein
when a portion of the first insulating film is to be exposed by removing a portion of the conductive layer, a trench is formed by patterning the conductive layer and first insulating film, and etching away the exposed portion of the semiconductor substrate by a predetermined depth, and
when the second insulating film is to be formed in the first processing chamber, the second insulating film is embedded in the trench in the first processing chamber.

8. A method according to claim 7, wherein the first insulating film is a tunnel insulating film, the conductive layer is a floating gate electrode, and the second insulating film is an element isolation insulating film.

9. A method according to claim 7, wherein the semiconductor device is a NAND flash memory.

10. A semiconductor device fabrication method comprising:
forming a first insulating film on a semiconductor substrate;
forming a first conductive layer on the first insulating film;
forming a second insulating film on the first conductive layer;
forming a second conductive layer on the second insulating film;
forming a plurality of projections by sequentially patterning the second conductive layer, second insulating film, first conductive layer, and first insulating film;
embedding a third insulating film in recesses formed between the projections adjacent to each other in a first processing chamber isolated from an outside atmosphere;
performing an oxygen radical process using oxygen radical generated by changing a gas containing oxygen into a plasma, a nitrogen radical process using nitrogen radical generated by changing a gas containing nitrogen into a plasma, or an oxygen radical and nitrogen radical process using oxygen radical and nitrogen radical generated by changing a gas containing oxygen and nitrogen into a plasma as a modification process on the third insulating film in the first processing chamber to prevent the third insulating film from absorbing water when the semiconductor substrate is exposed to the outside atmosphere, and unloading the semiconductor substrate from the first processing chamber to the outside atmosphere; and
annealing the third insulating film in a second processing chamber.

11. A method according to claim 10, wherein the third insulating film contains silicon and oxygen, or silicon and nitrogen.

12. A method according to claim 10, wherein
when the projections are formed, a plurality of projections each including a control gate electrode, inter-electrode insulating film, floating gate electrode, and tunnel insulating film are formed by sequentially patterning the second conductive layer, second insulating film, first conductive layer, and first insulating film, and
the method further comprises forming a source region and drain region, after the plurality of projections are formed, by ion-implanting a predetermined impurity into a surface portion of the semiconductor substrate.

13. A method according to claim 10, wherein the semiconductor device is a NAND flash memory.

14. A method according to claim 10, wherein at least one of the oxygen radical and the nitrogen radical are generated by radio frequency radiation.

15. A method according to claim 10, wherein at least one of the oxygen radical and the nitrogen radical are generated by radio frequency radiation.

* * * * *